(12) United States Patent
Kawakami et al.

(10) Patent No.: US 7,928,460 B2
(45) Date of Patent: Apr. 19, 2011

(54) LIGHT EMITTING ELEMENT AND MANUFACTURING METHOD THEREOF

(75) Inventors: Toshiyuki Kawakami, Mihara (JP); Yoshinobu Kawaguchi, Mihara (JP); Takeshi Kamikawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 222 days.

(21) Appl. No.: 12/314,214

(22) Filed: Dec. 5, 2008

(65) Prior Publication Data

US 2009/0200573 A1    Aug. 13, 2009

(30) Foreign Application Priority Data

Dec. 6, 2007    (JP) ................................. 2007-316006

(51) Int. Cl.
*H01L 33/10* (2010.01)
*H01L 33/16* (2010.01)
(52) U.S. Cl. ............. 257/98; 257/E33.003; 257/E33.06; 257/E33.068; 438/29
(58) Field of Classification Search .................... 257/98, 257/103, E33.003, E33.06, E33.068; 438/29, 438/46
See application file for complete search history.

(56) References Cited

U.S. PATENT DOCUMENTS

| 6,249,534 B1* | 6/2001 | Itoh et al. ................... 372/49.01 |
| 2004/0251471 A1* | 12/2004 | Dwilinski et al. ............ 257/103 |
| 2005/0249255 A1 | 11/2005 | Dwilinski et al. |
| 2008/0050855 A1 | 2/2008 | Dwilinski et al. |
| 2008/0285609 A1* | 11/2008 | Ohta et al. ............... 372/44.011 |

FOREIGN PATENT DOCUMENTS

| CN | 1663088 | 8/2005 |
| JP | 2008-198952 | 8/2008 |
| WO | WO 2004/004085 | 1/2004 |

OTHER PUBLICATIONS

Kuniyoshi Okamoto et al., "Continuous-Wave Operation of *m*-Plane InGaN Multiple Quantum Well Laser Diodes," Japanese Journal of Applied Physics, (JJAP Express Letter) vol. 46, No. 9, 2007, pp. L187-L189.

* cited by examiner

*Primary Examiner* — Benjamin P Sandvik
*Assistant Examiner* — W. Wendy Kuo
(74) *Attorney, Agent, or Firm* — Harness, Dickey & Pierce, P.L.C.

(57) ABSTRACT

In a laser chip 1 using a nitride semiconductor having a hexagonal crystal structure, the −c plane is used as a first resonator facet A, which is the side of the laser chip 1 through which light is emitted. On the first resonator facet A, that is, on the −c plane, a facet protection film 14 is formed. This ensures firm joint between the first resonator facet A and the facet protection film 14 and alleviates deterioration of the first resonator facet A.

12 Claims, 4 Drawing Sheets

LIGHT EMITTING ELEMENT AND MANUFACTURING METHOD THEREOF

This application is based on Japanese Patent Application No. 2007-316006 filed on Dec. 6, 2007, the contents of which are hereby incorporated by reference.

BACKGROUND OF THE INVENTION

1. Field of the Invention

The present invention relates to light emitting elements and a manufacturing method thereof. More particularly, the present invention relates to light emitting elements as exemplified by laser elements using nitride semiconductors, and to a manufacturing method thereof.

2. Description of Related Art

Being compounds between a group-III element, such as Al, Ga or In, and N, a group-V element, nitride-based semiconductors (for example, AlN, GaN and InN, including solid solutions of these, such as AlGaN and InGaN-in the present specification all these are collectively called nitride semiconductors) are, for their band structure and chemical stability, expected to find applications as materials for light emitting elements and power devices.

On the other hand, nitride-semiconductor elements are widely used that employ a sapphire or GaN substrate, which has a hexagonal crystal structure, and that have a layered structure of nitride semiconductors formed on the c-plane ((0001)-plane) of the substrate. In particular in applications as laser elements and as light emitting elements such as in light emitting diodes, some nitride-semiconductor elements employ, as an active layer, a quantum well structure composed of GaN (barrier layers)/InGaN (well layers). Here, increasing the In content of InGaN permits the light emission wavelength to be varied to the longer wavelength side.

Increasing the In content, however, increases the strain due to lattice mismatch between GaN and InGaN, and thus enlarges the piezoelectric field. As the piezoelectric field augments, the overlap between the wave function of electrons in the conduction band and the wave function of holes in the valence band diminishes, and thus electrons and holes in pairs are spatially separated from each other. This results in problems of increased threshold current and lower light emission efficiency. Moreover, since a nitride semiconductor having a wurzite structure, a hexagonal crystal structure, has no symmetric planes with respect to the c axis direction, polarities appear in a nitride semiconductor grown in the c axis direction, and thus spontaneous polarization occurs, another factor leading to the problems.

In order to address these problems, Non-patent Document 1 proposes a light emitting element in which a nitride semiconductor layered structure is formed on the m plane ({1-100} plane), which is a non-polar plane, of a GaN substrate, and in which a ridge stripe is formed in the a axis (<11-20> axis) direction or in the c axis direction. Also by forming a nitride semiconductor layered structure on the a plane ({11-20} plane), which also is a non-polar plane, of the GaN substrate, it is possible to reduce the piezoelectric field and thus spontaneous polarization.

Non-patent Document 1: Japanese Journal of Applied Physics, Vol. 46, No. 9, 2007, pp 187-189.

However, it is difficult to form a nitride semiconductor layered structure on the m or a plane of a substrate as compared with forming it on the c plane, resulting in a problem of lower yields. Since a nitride semiconductor laser element emits light with a short wavelength and high energy, its resonator facets are prone to be damaged, another factor leading to lower yields. In order to improve the yield, to surely prevent, among others, COD (Catastrophic Optical Damage), which is the cause of lower light emission strength and of damaged facets, becomes a main issue. In nitride semiconductors in particular, oxidation of facets may greatly affect the occurrence of COD.

SUMMARY OF THE INVENTION

In view of the foregoing, it is an object of the present invention to provide nitride semiconductor laser elements in which the resonator facets are protected with a view to improved yields.

In order to achieve the above object, a light emitting element comprising: a substrate; a layered structure composed of nitride semiconductors having a hexagonal crystal structure, the nitride semiconductors being stacked on the substrate in a direction substantially perpendicular to a c axis; a first protection film formed on a first facet on which an N-pole surface of the nitride semiconductors composing the layered structure appear; and a second protection film formed on a second facet opposite from the first facet, the second protection film having a higher reflectance than the first protection film.

In addition, in accordance with the present invention, a manufacturing method of a light emitting element comprising: a first step of stacking nitride semiconductors having a hexagonal crystal structure in a direction substantially perpendicular to a c axis and thereby making a layered structure composed of the nitride semiconductors on a substrate; a second step of forming, after the first step, a first facet on which an N-pole surface of the nitride semiconductors appear and a second facet opposite from the first facet; and a third step of forming, after the second step, a first protection film on the first facet and a second protection film on the second facet, the second protection film having a higher reflectance than the first protection film.

According to the present invention, as the first facet through which light is emitted, the N-pole plane of a nitride semiconductor is used. Since the N-pole plane is superior in reactivity compared with another plane, forming the first protective film on this plane allows reaction at the interface to provide firm joint. This makes it possible to reduce diffusion of oxygen over the interface, and to secure wide process windows for the first and second protection films. It is thus possible to improve the yields of the light emitting elements.

DETAILED DESCRIPTION OF PREFERRED EMBODIMENTS

GaN Crystal Structure

Figure 1:
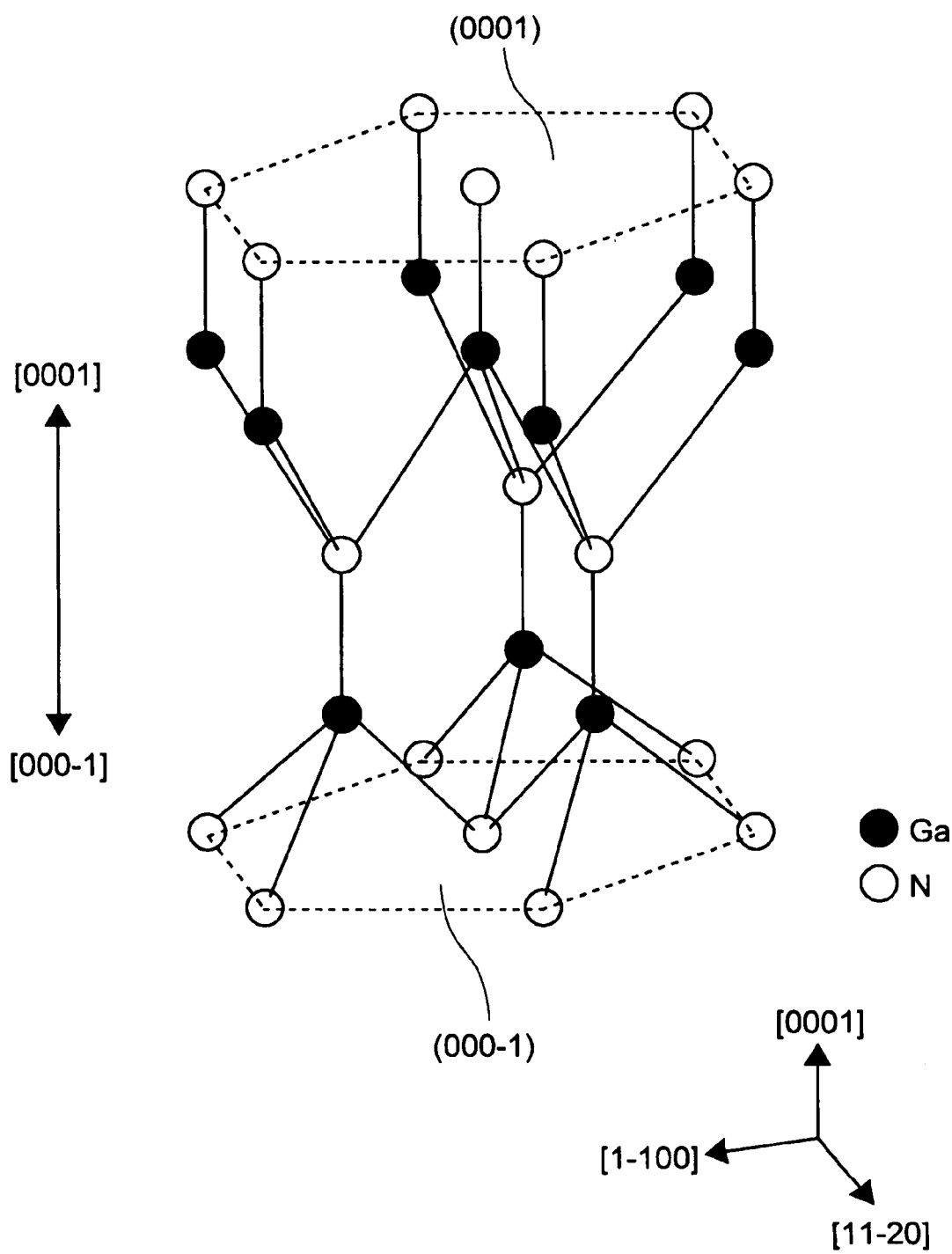
FIG. 1 is a schematic view of a crystal structure of GaN.

First, with reference to FIG. 1, a wurzite-type crystal structure will be described with GaN given as an example. FIG. 1 is a schematic view of a crystal structure of GaN, in which a black dot represents a Ga atom, and a white dot represents an N atom.

As shown in FIG. 1, the Ga atoms and the N atoms each have one bond parallel to the c axis and three bonds extending to the side opposite from that one bond and not parallel to the c axis. For each of the Ga atoms, the one bond that is parallel to the c axis extends to the [0001] side whereas the three bonds that are not parallel to the c axis extend to the [000-1] side. As opposed to this, for each of the N atoms, the one bond that is parallel to the c axis extends to the [000-1] side whereas the three bonds that are not parallel to the c axis extend to the [0001] side.

As described above, there are no symmetrical facets in the c axis direction in the GaN crystal structure. Accordingly, this crystal structure has obverse and reverse sides with respect to the c axis. More specifically, the (0001) and (000-1) planes are not equivalent planes and are different in chemical properties. In particular, compared with the Ga-pole plane ((0001) plane, +c plane), in which the bonds of Ga atoms parallel to the c axis point to the surface, the N-pole plane ((000-1) plane, −c plane), in which the bonds of N atoms parallel to the c axis point to the surface, is superior in reactivity.

Note that the c, a and m axes are in a perpendicular relationship to one another. Accordingly, the ±c, a and m planes are also in a perpendicular relationship to one another.

Laser Chip Configuration

Figure 2:
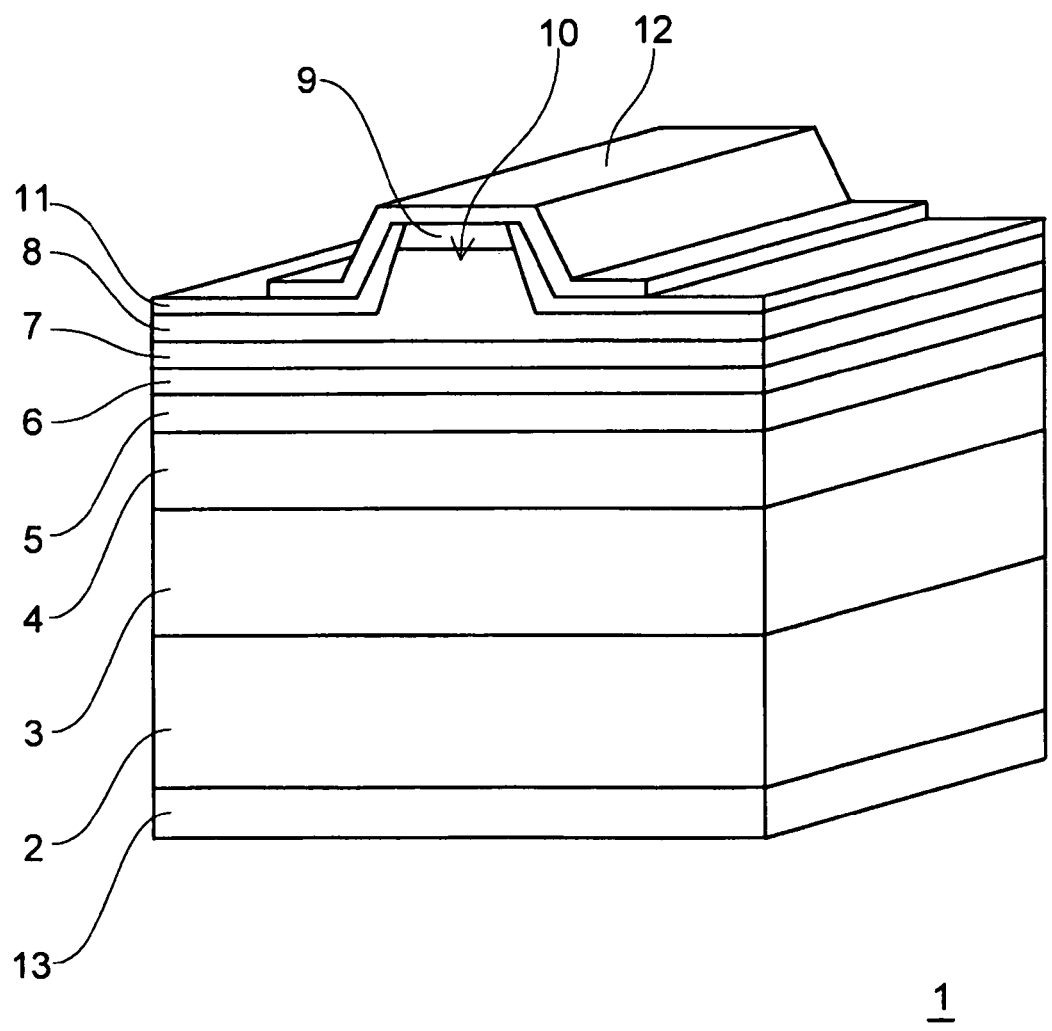
FIG. 2 is a perspective view schematically showing a laser chip embodying the present invention.

With a laser element given as an example of a nitride semiconductor light emitting element embodying the present invention, an example of its structure and manufacturing method will be described below. First, with reference to FIG. 2, the structure of a laser chip in this embodiment will be described. FIG. 2 is a schematic perspective view of the laser chip in this embodiment. In the following description, the principal plane of a substrate on top of which different layers are stacked is referred to as the growth surface, and the direction that is perpendicular to the growth surface and in which those different layers are stacked is referred to as the upward direction. The growth surface of the substrate 2 is selected so as to be substantially parallel to the a or m plane, that is, so as to be substantially perpendicular to the c plane.

As shown in FIG. 2, the nitride semiconductor laser chip 1 in this embodiment includes: a substrate 2 formed of GaN; an n-type buffer layer 3 composed of n-type GaN; an n-type cladding layer 4 composed of n-type $Al_{0.06}Ga_{0.94}N$; an n-type guide layer 5 composed of n-type GaN; an active layer 6 composed of InGaN and GaN; a p-type current blocking layer 7 composed of $Al_{0.3}Ga_{0.7}N$; a p-type cladding layer 8 composed of $Al_{0.05}Ga_{0.95}N$; and a p-type contact layer 9 composed of p-type GaN.

The p-type cladding layer 8 has a shape extending in a predetermined direction and protruding upwards. Only on top of this protruding part, the p-type contact layer 9 is formed. Hereinafter, the protruding part of the p-type cladding layer 8 and the p-type contact layer 9 formed on the upper surface of the layer 8 are collectively referred to as a ridge stripe 10, and a predetermined direction in which the ridge stripe 10 extends is referred to as a longitudinal direction of the ridge stripe 10.

The ridge stripe 10 extends in a direction substantially parallel to the ±c axes. Accordingly, the resonator facets are substantially parallel to the ±c planes. In a case where a surface substantially parallel to the m plane is selected as the growth surface of the substrate 2, the side faces in a direction substantially perpendicular to the longitudinal direction of the ridge stripe 10 are substantially parallel to the a plane. On the other hand, in a case where a surface substantially parallel to the a plane is selected as the growth surface of the substrate 2, the side faces in a direction substantially perpendicular to the longitudinal direction of the ridge stripe 10 are substantially parallel to the m plane.

An insulating layer 11 composed of $SiO_2$ or $ZrO_2$ is provided on the upper surface of a part of the p-type cladding layer 8 on which the ridge stripe is not formed, and also on the side surfaces of the ridge stripe. A p-electrode 12 composed of Pd/Mo/Au is provided so as to cover the entire area of the upper surface of the p-type contact layer 9 and the upper surface of the insulating layer 11 in proximity of the p-type contact layer 9. An n-electrode 13 composed of Hf/Al is provided on the reverse surface of the substrate 2 opposite from the growth surface. A protection film (not shown) is provided on the facets of the resonator of the laser chip, the resonator facets being substantially perpendicular to the longitudinal direction of the ridge stripe 10. A detailed description of the protection film will be given later.

Laser Chip Manufacturing Method

Next, an example of a manufacturing method of the laser chip described above will be described with reference to FIG. 2. In this example, a plurality of laser chips 1 are obtained by splitting a wafer on which a plurality of layered structures like the one described above are formed. Accordingly, a wafer is fabricated first. Here, it is assumed that a GaN substrate 2 is used, and that the a or m plane is used as the growth surface.

First, on the growth surface of the substrate 2, a buffer layer 3 with a thickness of 0.2 μm is formed and, further thereon, an n-type cladding layer 4 with a thickness of 2.3 μm is formed. Yet further thereon, an n-type guide layer 5 with a thickness of 0.02 μm is formed and, still further thereon, an active layer 6 is formed.

The active layer 6 is formed by forming a 70 m thick GaN protection layer on top of a multiple quantum well layer, the latter having 4 nm thick InGaN layers as well layers and 8 nm thick GaN layers as barrier layers laid in the order of GaN/InGaN/GaN/InGaN/GaN/InGaN/GaN.

Moreover, on the active layer 6, the p-type current blocking layer 7 with a thickness of 20 nm is stacked, and the p-type cladding layer 8 with a thickness of 0.5 μm is stacked thereon. Furthermore, on the p-type cladding layer 8, the p-type contact layer 9 with a thickness of 0.1 μm is stacked. When this happens, the above-described ridge stripe 10 is not yet formed, and thus the p-type cladding layer 8 and the p-type contact layer 9 are covering the entire top area of the wafer.

The thus stacked nitride semiconductor layers each grow epitaxially and accordingly have an orientation based on the orientation of the underlying crystal. Such growth can be achieved by a method such as MOCVD (Metal Organic Chemical Vapor Deposition), MBE (Molecular Beam Epitaxy) or HVPE (Hydride Vapor Phase Epitaxy).

After the nitride semiconductor layers are stacked as described above, the ridge strip 10 is formed. When the ridge stripe 10 is formed, an etching prevention film such as a resist film is formed by a method such as photolithography on a part of the p-type contact layer 9 on which the ridge stripe is formed. After that, reactive ion etching is performed with gas such as $SiCl_4$, $Cl_2$ or Ar. The part on which the etching prevention film is not formed is etched thereby, and a plurality of ridge stripes 10 extending in the predetermined direction are made on the wafer. Meanwhile, in the part where the prevention film is not formed, parts of the p-type contact layer 9 and of the p-type cladding layer 8 are etched so that the p-type cladding layer 8 is exposed.

The width of the etching prevention film determines the width of the ridge stripe 10, and the width of the ridge stripe 10 determines the properties of the light emitted from the laser chip 1. For example, giving the ridge stripe the width of 1 to 3 µm provides a laser chip that emits single-mode light with respect to the horizontal direction, making the laser chip usable in optical pickups and the like. For another example, the width of about 3 to 10 µm there provides a laser chip that lases at a high power and in the multiple mode, making the laser chip usable in illumination devices and the like.

After the ridge stripe 10 is made, with the etching prevention film left on the ridge stripe 10, an insulating layer 11 is formed on the β-type cladding layer 8 and on the ridge stripe 10 having the etching prevention film formed on the upper surface thereof. The insulating layer 11 can be formed by various sputtering methods including magnetron sputtering and ECR (Electron Cyclotron Resonance), sputtering, CVD or the like.

After that, the etching prevention film and the insulating layer thereon are removed simultaneously so that the p-type contact layer 9 is exposed. A p-electrode 12 is formed on the upper surfaces of the p-type contact layer 9 and the insulating layer 11 in proximity thereof. Furthermore, an n-electrode 13 is formed on the reverse surface of the substrate 2 opposite from the growth surface. The p-electrode 12 and the n-electrode 13 can be formed by deposition methods including EB (Electron Beam) deposition and resistor heating deposition as well as various sputtering methods mentioned above. Before the n-electrode 13 is formed, the reverse surface of the substrate 2 opposite from the growth surface may be polished to reduce the thickness of the substrate down to approximately 100 µm.

The thus obtained wafer is cleaved, or is dry-etched and split, in the direction perpendicular to the longitudinal direction of the ridge stripe, so as to be formed into bars. Then a protection film is formed on the split faces of the bars, which are then split in the direction substantially parallel to the longitudinal direction of the ridge stripe, so as to be formed into laser chips like the one shown in FIG. 2. The details on how the protection film is formed will be, along with the structure of the protection film, given later.

Figure 3:
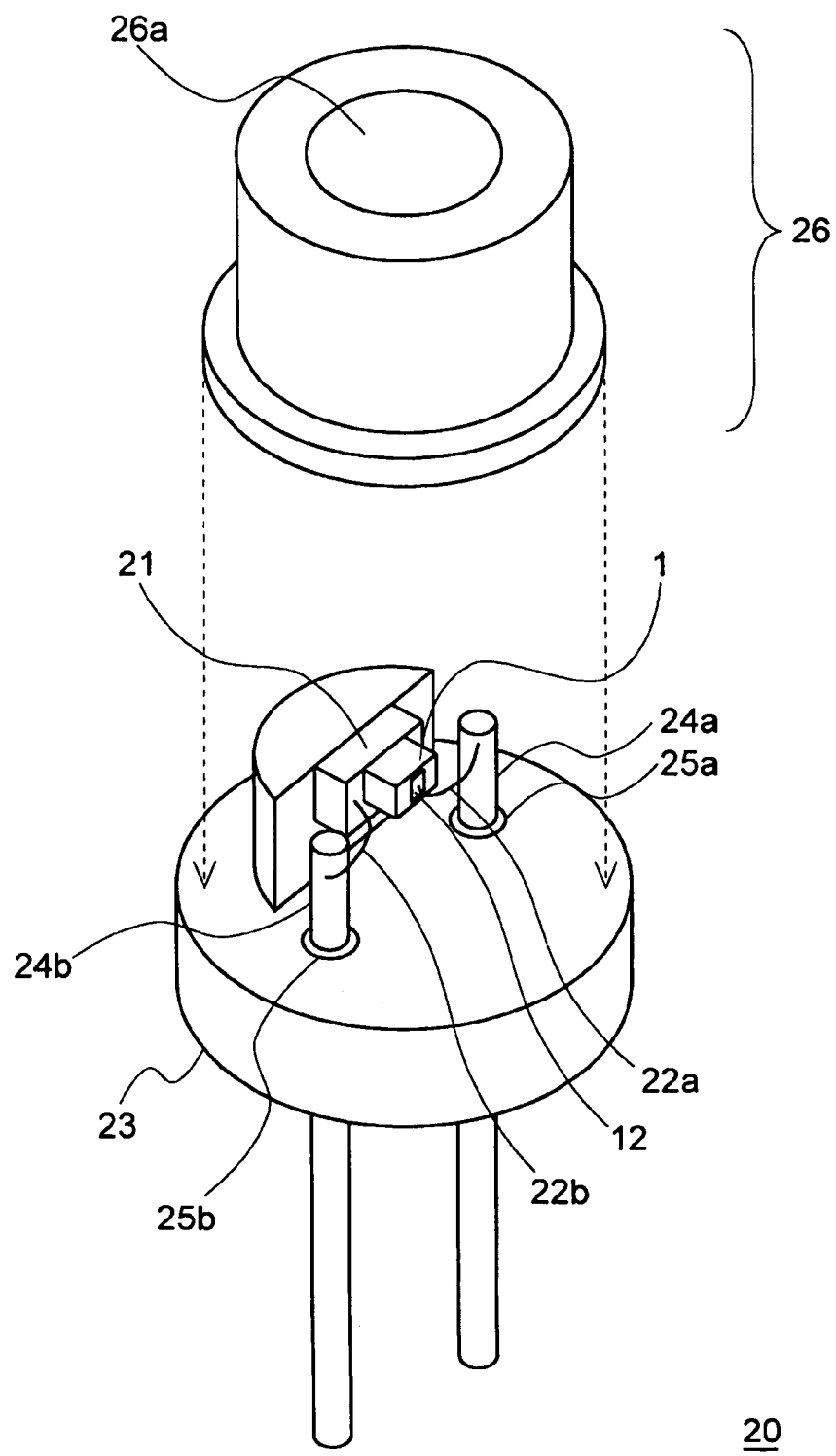
FIG. 3 is a perspective view schematically showing an example of a laser element embodying the present invention by way of example.

The laser chip 1 thus obtained is incorporated, for example, in a laser element 20 as shown in FIG. 3, which is a perspective view schematically showing an example of a laser element. As shown in this figure, the laser chip 1 is mounted in the laser element 20 by fixing the n-electrode 13 to a submount 21 with solder or the like and by bonding power-supplying wires 22a and 22b to the p-electrode 12 and the submount 21, respectively.

In the laser element 20 structured as described above, the wires 22a and 22b bonded to the p-electrode 12 and the submount 21 of the laser chip 1 are connected to pins 24a and 24b, respectively, each penetrating a stem 23. The pins 24a and 24b are insulated from the stem 23 with insulating rings 25a and 25b, respectively. The submount 21 is fixed on the stem 23. Moreover, a cap 26 equipped with a window 26a for transmitting light emitted from the laser chip 1 is attached to the stem 23 so that the chip 1 is encapsulated with the stem 23 and the cap 26. Supplied with current via the pins 24a and 24b, and wires 22a and 22b, the laser chip 1 oscillates so as to emit light through the window 26.

A pad electrode may be additionally formed on the p-electrode 12 so that wire bonding may be performed on the pad electrode. With this structure, wire-bonding becomes easier to perform. The substrate 2 may be a so-called just-substrate in which the growth surface coincides with the a or m plane, or a so-called off-substrate in which the growth surface is slightly deviated from the a or m plane. Note that using the off substrate improves the crystalline of the nitride semiconductor layers stacked on the substrate.

Although GaN, which is conductive, is used as the material of the substrate 2 in this example, an insulative material such as sapphire may instead be used. In a case where sapphire, for example, is used, when the r plane ((10-12) plane) is selected as the growth surface of the substrate 2, the nitride semiconductor layers are stacked in the a axis direction. For the substrate, any material, for example, SiC or ZnO may be used; in any way, it is assumed that the nitride semiconductor layers are stacked in the a or m axis direction substantially perpendicular to the c axis.

In a case where an insulative material such as sapphire is used for the substrate 2, the n-electrode 13 can not be formed on the reverse side of the substrate 2 opposite from the growth surface. For this reason, the laser chip may be structured such that an area for exposing the n-type buffer layer 3 is provided in an area separate from the laser structure, and the n-electrode 13 is formed in that area. In a case where a heterogeneous material such as sapphire is used for the substrate 2, a buffer layer and/or other layers may be added as necessary.

The above-described configuration and manufacturing method of the laser chip 1 are presented by way of example only. That is, the protection film described below can also be applied to light emitting elements of any other structures. For example, the protection film described below may be formed on the resonator facets inside a laser chip having such a structure that an insulating layer covers the side faces of the active layer as well. A structure without a ridge stripe may be adopted. The protection film described below may also be formed on the resonator facets inside a laser chip that achieves current confinement by taking advantage of high resistance around a current injection area.

Protection Film

Figure 4:
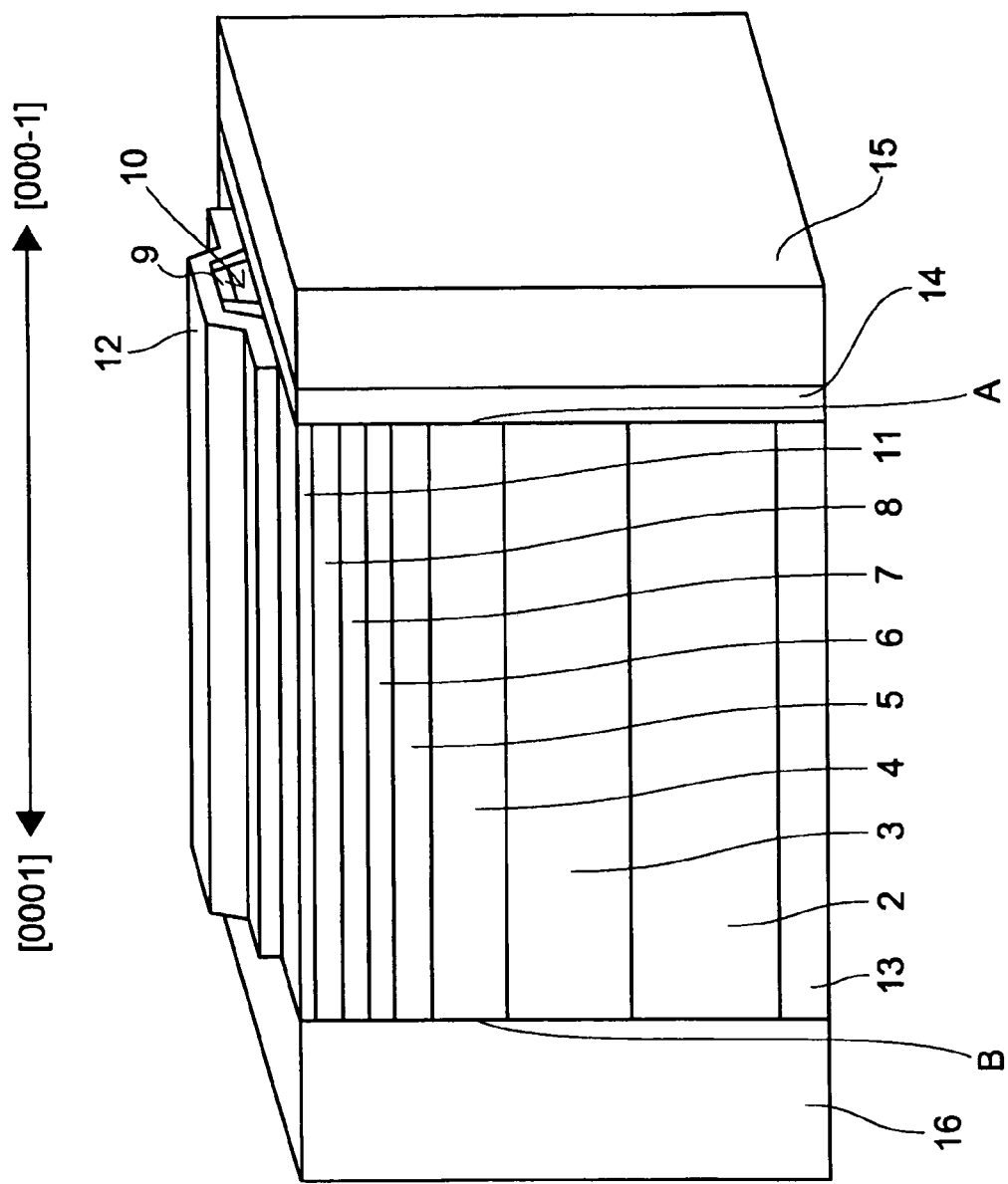
FIG. 4 is a perspective view schematically showing the laser chip embodying the present invention.

Next, the protection film that is formed on the light emitting element in this embodiment will be described with reference to FIG. 4, which is a perspective view schematically showing the laser chip in this embodiment. FIG. 4 shows a case where the longitudinal direction of the ridge stripe 10 is substantially parallel to the c axis direction. Here, the side face on the −c plane on the light-emission side is referred to as first resonator facet A, and the side face on the +c plane on the reflection side is referred to as the second resonator facet B. Note that although FIG. 4 shows the ridge stripe without the protection films 14 to 16 formed on the ridge stripe side faces, the protection films 14 to 16 may be formed thereon.

As shown in FIG. 4, the protection films 14 to 16 are formed on the surfaces of the first and second resonator facets A and B. On the first resonator facet A, a facet protection film 14 of AlN or the like and a light-emission side protection film 15 of $Al_2O_3$ or the like are formed. The facet protection film 14 is formed directly on the surface of the first resonator facet A, and the light-emission side protection film 15 is formed on the surface of the facet protection film 14.

Here, as the first resonator facet A, the −c plane (an N-pole plane) is used, which is relatively reactive among all the crystal planes.

When combined, the protection films 14 and 15 exhibit a specific reflectance. For example, forming the AlN film 14 with a thickness of 20 nm and the light-emission side $Al_2O_3$ film 15 with a thickness of 110 nm provides a reflectance of approximately 18%. Then providing the second resonator facet B with a reflection-side protection film 16 having a reflectance of approximately 100% permits light to be efficiently emitted through the first resonator facet A.

The reflection-side protection film 16 that is formed on the second resonator facet B may have multiple layers of $SiO_2$, $TiO_2$ and the like. For example, a sufficient reflectance can be obtained by alternately stacking $SiO_2$ and $TiO_2$ layers in four layers.

Using the −c plane as the first resonator facet A through which light is emitted and forming the facet protection film 14 thereon as described above helps obtain a firm joint at the interface between the first resonator facet A and the facet protection film 14. And forming this firm interface makes it possible to reduce oxidation of the facets and the resulting effects. Consequently, it is possible to provide light emitting elements capable of reducing the effects of changes in the quality of the protection films 14 to 16, if any, (e.g., increased probability of occurrence of COD) and operating in a stable state. In other words, it is possible to broaden process windows for the protection films 14 to 16 and hence to improve the yield of the light emitting elements.

The facet protection film 14 may also be formed on the surface of the second resonator facet B. In this case, it should be noted that the second resonator facet B is on the +c plane, and hence has lower reactivity compared with the −c plane. In addition, because of its lower light density, the second resonator facet B is not so problematic as the first resonator facet A, and has very little effect on the yield.

Moreover, it is preferable that the facet protection film 14 be a single crystal. It may be a polycrystal but, in that case, one that has a large crystal grain or that is aligned is preferred. Since oxygen easily diffuses through the crystal grain boundaries, a structure with no crystal grain boundary makes the oxygen diffusion difficult. Even a polycrystal, provided that it has a large crystal grain or is aligned, can make less of the oxygen diffusing through the crystal grain boundaries arrive at the first resonator facet A and narrows the oxygen diffusion area down to a very small area. It is thus possible to prevent random diffusion of oxygen and to improve the yield.

Furthermore, using a material with a good crystalline as mentioned above for the facet protection film 14 improves thermal conductivity and chemical stability, and hence decreases the absorption of the emitted light. This makes it possible to improve the yield further.

The facet protection film 14 described above can be formed by a method such as ECR sputtering or MBE. These methods permit precise control of the energy of atoms during the formation of the protection film 14. Consequently, using those methods makes it possible to easily obtain single-crystalline films or aligned polycrystalline films.

It is also possible to form a crystalline film by first forming an amorphous film by use of another film formation method and then treating it with heat treatment or electron beam irradiation.

In a case where the facet protection film 14 is an aligned polycrystalline film, it may be aligned in any direction. For example, it may be aligned in a direction substantially perpendicular to the first resonator facet A so that the facets of crystal grains substantially parallel to the first resonator facet A are substantially on the same crystal plane and have a rotational relationship. It may instead be aligned in a direction substantially parallel to the first resonator facet A so that the faces of crystal grains substantially parallel to the first resonator facet A are substantially parallel to a direction of the alignment of the crystals.

When the wafer is split into bars so as to obtain the first and second resonator facets A and B, dry-etching may be used, and those facets A and B may be tilted with an off angle of three degrees or less. This structure makes the first resonator facet A deviated from the −c plane by a small angle, and thereby improves the evenness and crystalline of the facet protection film 14 that is formed on the surface. Consequently, it is possible to improve the yield. Note that even if tilted with an off angle in this way, the facet A still has an N-pole and hence is capable of firmly joining the facet protection film 14 thereto.

As the material of the facet protection film 14, a nitride such as a nitride of aluminum, gallium or silicon may be used, or a combination of a plurality of films composed of any of those materials may be used, or a mixture of those materials may be used. Nitride materials such as these are stable, and are thus less prone to be damaged by the emitted light and others. In addition, they provide a firmer joint to the first resonator facet A. Moreover, the entry of oxygen into the protection film 14 can be delayed, thus reducing the speed of oxidation in the first resonator facet A. In particular, AlN has, apart from those just mentioned, characteristics such as high thermal conductivity, superior thermal dissipation, and low absorption of the emitted light owing to a wide bandgap. Accordingly, the use of a material containing AlN is preferable.

The nitride materials forming the facet protection film 14 may contain an element such as oxygen, carbon or argon. A very low content of oxygen in the facet protection film 14 is preferable because it further delays the entry of oxygen into the protection film 14 and thereby reduces absorption of oxygen into the film.

The use of an oxide in the light-emission side protection film 15 facilitates control of reflectance. This can also delay the entry of oxygen into the facet protection film 14, thereby further retarding oxidation in the first resonator facet A. In particular, it is preferable to use a material having a bandgap wide enough to transmit the emitted light. Specifically, it is an oxide of aluminum, titan, tantalum, niobium, hafnium or yttrium. A mixture of those oxides may also be used.

The present invention relates to nitride semiconductor light emitting elements and a manufacturing method thereof. More particularly, the present invention relates to light emitting elements as exemplified by laser elements using GaN and InGaN in the active layers, and to a manufacturing method thereof. The present invention is suitably applied to laser elements whose light emission wavelength is shifted to the longer wavelength side with an increased In composition.

What is claimed is:

1. A light emitting element comprising:
   a substrate;
   a layered structure composed of nitride semiconductors having a hexagonal crystal structure, the nitride semiconductors being stacked on the substrate in a direction substantially perpendicular to a c axis;
   a first protection film formed on a first facet on which an N-pole surface of the nitride semiconductors composing the layered structure appears; and
   a second protection film formed on a second facet opposite from the first facet, the second protection film having a higher reflectance than the first protection film.

2. The light emitting element of claim 1, wherein the first protection film includes a nitride material.

3. The light emitting element of claim 2, wherein the nitride material is in contact with the first facet.

4. The light emitting element of claim 3, wherein the first protection film comprises a facet protection film composed of the nitride material and a light-emission side protection film composed of an oxide material.

5. The light emitting element of claim 4, wherein the oxide material contains at least one of oxides of aluminum, titan, tantalum, niobium, hafnium and yttrium.

6. The light emitting element of claim 2, wherein the nitride material is single-crystalline or polycrystalline.

7. The light emitting element of claim 6, wherein the nitride material is a crystal aligned in a predetermined direction.

8. The light emitting element of claim 2, wherein the nitride material contains at least one of nitrides of aluminum, gallium and silicon.

9. The light emitting element of claim 1, wherein the layered structure is stacked in a direction of an a axis or an m axis.

10. A manufacturing method of a light emitting element comprising:
   a first step of stacking nitride semiconductors having a hexagonal crystal structure in a direction substantially perpendicular to a c axis and thereby making a layered structure composed of the nitride semiconductors on a substrate;
   a second step of forming, after the first step, a first facet on which an N-pole surface of the nitride semiconductors appears and a second facet opposite from the first facet; and
   a third step of forming, after the second step, a first protection film on the first facet and a second protection film on the second facet, the second protection film having a higher reflectance than the first protection film.

11. The manufacturing method of claim 10, wherein in the third step, at least part of the first protection film is formed by an ECR sputtering method or an MBE method.

12. The manufacturing method of claim 10, wherein the second step is carried out by cleaving or dry-etching.

* * * * *